United States Patent
Lattimer

(10) Patent No.: US 10,184,168 B2
(45) Date of Patent: *Jan. 22, 2019

(54) IMC EVAPORATOR BOAT-THERMAL INSULATION CARTRIDGE ASSEMBLY

(71) Applicant: Kennametal Inc., Latrobe, PA (US)

(72) Inventor: Robinson E. Lattimer, Wilton, CT (US)

(73) Assignee: KENNAMETAL INC., Latrobe, PA (US)

( * ) Notice: Subject to any disclaimer, the term of this patent is extended or adjusted under 35 U.S.C. 154(b) by 302 days.

This patent is subject to a terminal disclaimer.

(21) Appl. No.: 14/600,471

(22) Filed: Jan. 20, 2015

(65) Prior Publication Data

US 2016/0208374 A1    Jul. 21, 2016

(51) Int. Cl.
 *C23C 14/24*     (2006.01)
 *C23C 14/26*     (2006.01)

(52) U.S. Cl.
 CPC ........... *C23C 14/243* (2013.01); *C23C 14/24* (2013.01); *C23C 14/26* (2013.01)

(58) Field of Classification Search
 CPC ............... C23C 14/243; C23C 14/24–14/325
 USPC ............................................. 118/726–727
 See application file for complete search history.

(56) References Cited

U.S. PATENT DOCUMENTS

| | | | |
|---|---|---|---|
| 2,635,579 A * | 4/1953 | Chadsey, Jr. ......... | C23C 14/246 118/726 |
| 2,840,458 A | 6/1958 | Hamister | |
| 3,113,889 A | 12/1963 | Cooper et al. | |
| 3,181,968 A | 5/1965 | Mandorf | |
| 3,345,448 A | 10/1967 | Malkin | |
| 3,572,672 A * | 3/1971 | Harel .................... | C23C 14/243 118/726 |
| 3,676,006 A | 7/1972 | Velzel | |
| 3,724,996 A | 4/1973 | Montgomery | |
| 4,264,803 A | 4/1981 | Shinko | |
| 4,446,357 A * | 5/1984 | Barshter ................ | C23C 14/26 118/726 |
| 4,526,840 A * | 7/1985 | Jerabek ................ | C04B 41/009 118/726 |
| 4,880,960 A * | 11/1989 | Remondiere ......... | C23C 14/243 118/726 |
| 5,032,366 A | 7/1991 | Finicle | |

(Continued)

FOREIGN PATENT DOCUMENTS

| DE | 10 2007 045 289 A1 | 4/2009 |
|---|---|---|
| WO | 2006117119 A1 | 9/2006 |
| WO | 2008025447 A1 | 6/2008 |

OTHER PUBLICATIONS

Machine generated Translation of DE 10 2007 045 289 A1 Powered by the European Patent Office and Google (20 pages).

(Continued)

*Primary Examiner* — Aiden Lee
(74) *Attorney, Agent, or Firm* — Larry R. Meenan

(57) ABSTRACT

An IMC evaporator boat-thermal insulation cartridge assembly that includes an IMC evaporator boat and a thermal insulation cartridge, which has a container containing a thermal insulation body containing a cavity. The IMC evaporator boat is received within the cavity so as to define an air space between the IMC evaporator boat and the thermal insulation body. A heater is contained within the air space.

10 Claims, 3 Drawing Sheets

(56) References Cited

U.S. PATENT DOCUMENTS

| | | | |
|---|---|---|---|
| 5,182,149 A | | 1/1993 | Finicle |
| 5,182,567 A | | 1/1993 | Wilder |
| 5,239,612 A | | 8/1993 | Morris |
| 5,253,266 A | * | 10/1993 | Knodle, III ......... C30L 323/066 118/726 |
| 5,604,164 A | | 2/1997 | Montgomery et al. |
| 5,904,781 A | | 5/1999 | Goodman et al. |
| 5,951,769 A | | 9/1999 | Barnard |
| 6,081,652 A | | 6/2000 | Seifert |
| 6,085,025 A | | 7/2000 | Seifert |
| 6,645,572 B2 | | 11/2003 | Seifert |
| 7,494,616 B2 | | 2/2009 | Rusinko, Jr. |
| 2006/0062900 A1 | * | 3/2006 | Selvamanickam ... C23C 16/408 427/62 |
| 2008/0264342 A1 | * | 10/2008 | Saito ....................... C23C 14/12 118/726 |
| 2009/0217876 A1 | | 9/2009 | Epstein |
| 2011/0223552 A1 | * | 9/2011 | Kobayashi ............ C23C 16/463 432/4 |
| 2012/0009728 A1 | * | 1/2012 | Li ....................... C23C 14/0623 438/89 |
| 2013/0112288 A1 | * | 5/2013 | Liu ....................... C23C 14/243 137/334 |

OTHER PUBLICATIONS

Jan. 13, 2017 Office action (3 months) 1 K-05929-US-NP.

Smalc, Martin et al., Thermal Performance of Natural Graphite Heat Spreaders, Interpack 2005-73073, Proceedings of IPACK2005, ASME InterPACK '05, Jul. 17-22, San Francisco, CA, pp. 1-11.

Cook, B.A. et al, Estimation of Surface Energy and Bonding Between AlMgB14 and TiB2, Journal of Physics and Chemistry of Solids 71 (2010), pp. 824-826.

Xue, Jia-Xiang et al., Pressure-induced Preferential Grain Growth, Texture Development and Anisotropic Properties of Hot Pressed Hexagonal Boron Nitride Ceramics, SciVerse ScienceDirect, Scripta Materialia 65 (2011), pp. 966-969.

Rathod, Nimish, The Effect of Surface Properties of Boron Nitride on Polymer Processability, The University of British Columbia, Jun. 2003, 93 pgs.

Aug. 24, 2017 Final Office Action corresponding to K-05929-US-NP.

Evaporator Boats, Kennametal Sintec (2017), 8 pages.

* cited by examiner

IMC EVAPORATOR BOAT-THERMAL INSULATION CARTRIDGE ASSEMBLY

BACKGROUND

The present invention pertains to an intermetallic composite (IMC) evaporator boat-thermal insulation cartridge assembly useful for the evaporation of metals. More specifically, the present invention relates to an IMC evaporator boat-thermal insulation cartridge assembly evaporator boat assembly that includes an IMC evaporator boat and a thermal insulation cartridge that carries the IMC evaporator boat, and wherein the IMC evaporator boat-thermal insulation cartridge assembly is useful for the evaporation of metals in conjunction with a vacuum apparatus.

Heretofore, IMC evaporator boats have been useful to provide a container or platform on which to melt metals so as to evaporate the metals for deposition on a substrate. Exemplary patent documents that pertain to evaporator boats or other heating devices are as follows: U.S. Pat. No. 2,840,458 to Hamister, U.S. Pat. No. 3,181,968 to Mandorf, U.S. Pat. No. 3,345,448 to Malkin, U.S. Pat. No. 3,724,996 to Montgomery, U.S. Pat. No. 4,264,803 to Shinko, U.S. Pat. No. 5,032,366 to Finicle, U.S. Pat. No. 5,182,149 to Finicle, U.S. Pat. No. 5,239,612 to Morris, U.S. Pat. No. 6,081,652 to Seifert, U.S. Pat. No. 6,085,025 to Seifert, U.S. Pat. No. 6,645,572 to Seifert, U.S. Pat. No. 5,604,164 to Montgomery et al., U.S. Patent Application Publication NO. US 2009/0217876 A1 to Epstein, German Offenlegungsschrift DE 10 2007 045 289 to ESK Ceramics GmBH; PCT Patent Application Publication WO 2006/117119 A1 to ESK Ceramics GmBH, and PCT Patent Application Publication NO. WO 2008/025447 A1 to ESK Ceramics GmbH.

SUMMARY

In one form thereof, the invention is an IMC evaporator boat-thermal insulation cartridge assembly. The assembly comprises an IMC evaporator boat, and a thermal insulation cartridge. The thermal insulation cartridge comprises a container containing a thermal insulation body containing a cavity. The IMC evaporator boat is received within the cavity so as to define an air space between the IMC evaporator boat and the thermal insulation body (70). There is a heater contained within the air space.

BRIEF DESCRIPTION OF THE DRAWINGS

The following is a brief description of the drawings that form a part of this patent application.

DETAILED DESCRIPTION

Figure 1:
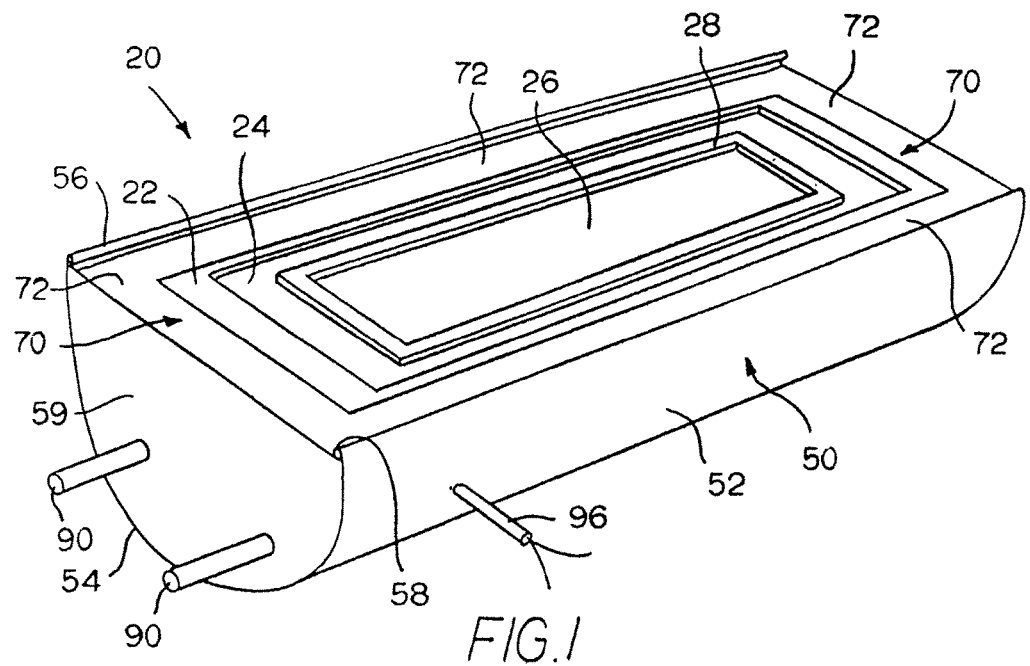
FIG. 1 is an isometric view of a specific embodiment of the IMC evaporator boat-thermal insulation cartridge assembly.
Figure 2:
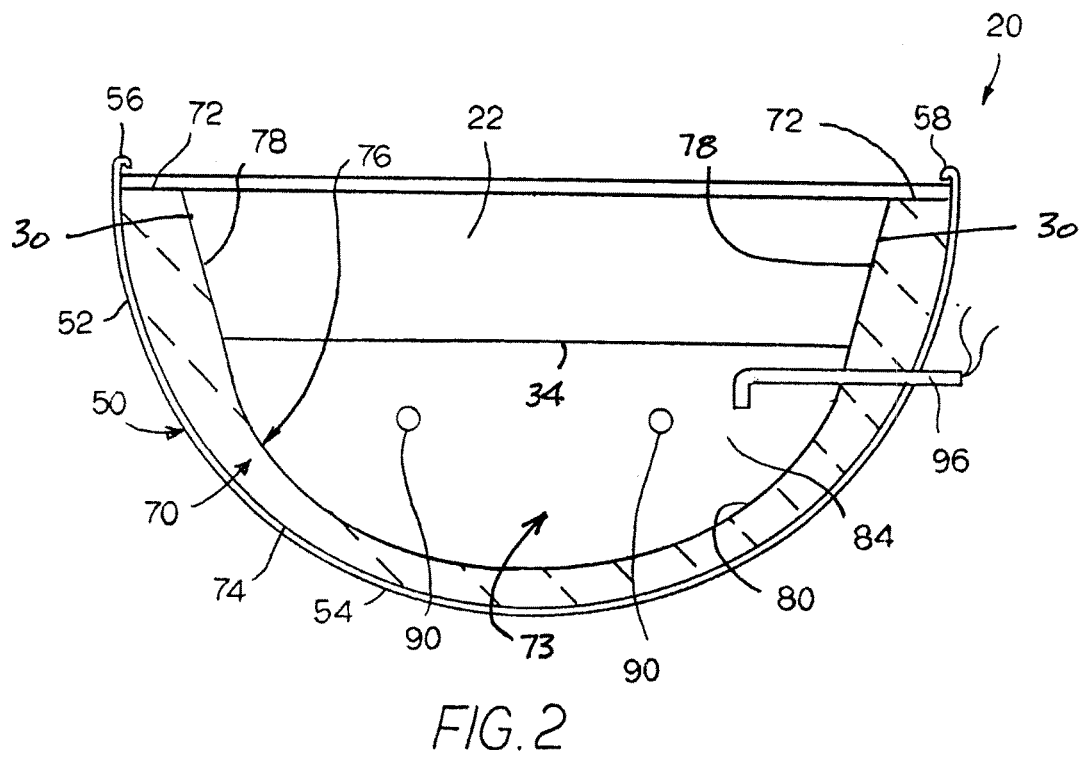
FIG. 2 is an end view of the IMC evaporator boat-thermal insulation cartridge assembly of FIG. 1 wherein one end of the container of the container has been removed.
Figure 3:
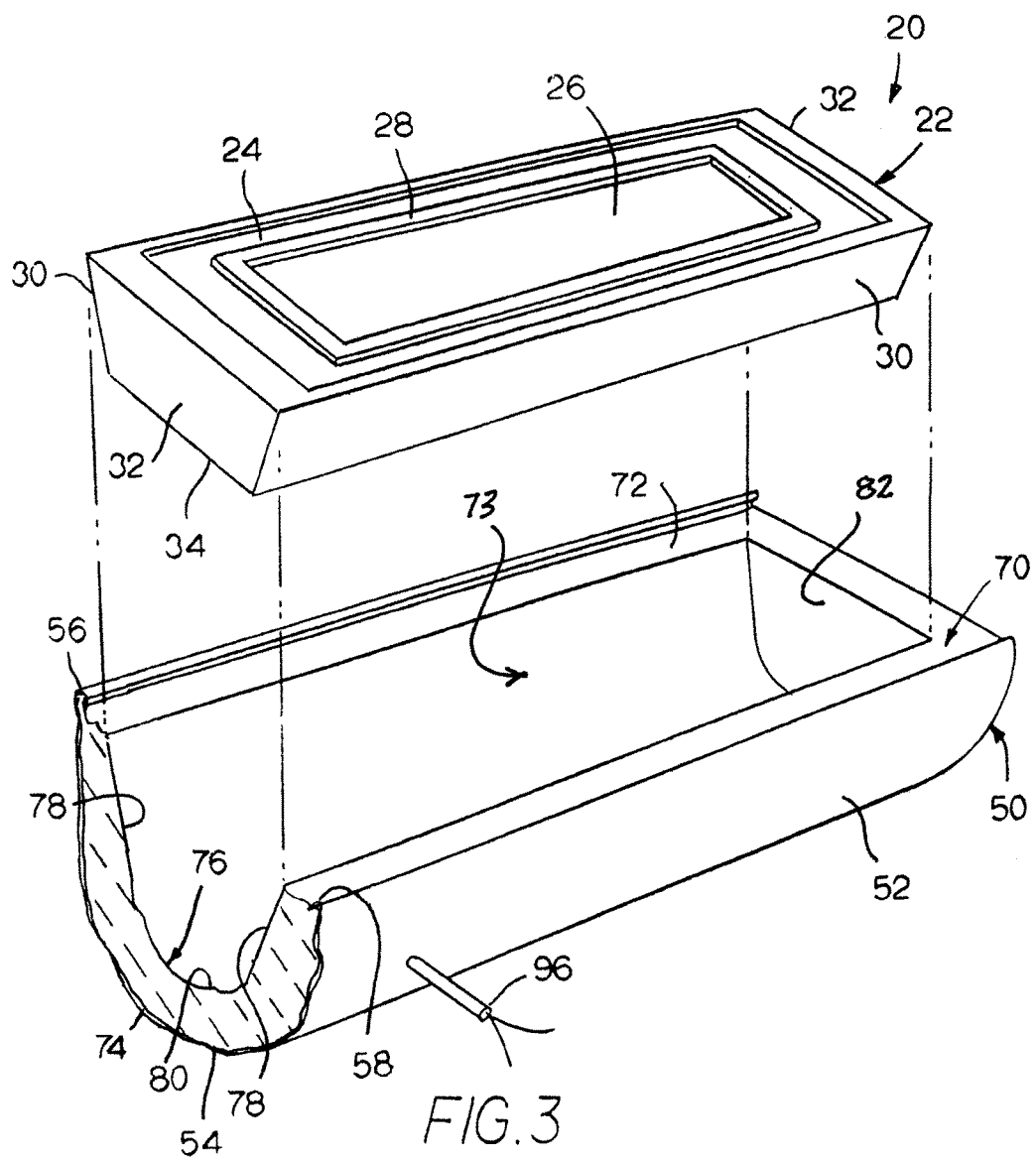
FIG. 3 is an isometric view of the specific embodiment of the IMC evaporator boat-thermal insulation cartridge assembly of FIG. 1 wherein the IMC evaporator boat is exploded away from the thermal insulation cartridge.

Referring to the drawings, FIGS. 1 through 3 illustrate a specific embodiment of the IMC evaporator boat-thermal insulation cartridge assembly generally designated as 20. The IMC evaporator boat-thermal insulation cartridge assembly 20 comprises an evaporator boat 22 and a thermal insulation cartridge 50. The IMC evaporator boat 22 has a top surface 24 that contains a pool 26 wherein a retaining wall 28 defines the pool 26. The IMC evaporator boat 22 has side walls 30 (which are angled), end walls 32 and a bottom surface 34. IMC The evaporator boat 22 can be made from any of the following intermetallic composites BN—TiB$_2$ or BN—AlN—TiB$_2$.

The thermal insulation cartridge 50 comprises an elongate container 52. The container 52 has an arcuate portion 54 that terminates in opposite lips 56 and 58. The container 52 has opposite end surface 59. The thermal insulation cartridge 50 further comprises an elongate thermal insulation body 70. The thermal insulation body 70 may be made from any of the following materials: alumina-silica fibers or alumina fibers.

The thermal insulation body 70 has a top surface 72 and contains a cavity 73. The thermal insulation body 70 has an exterior surface 74. The cavity 73 is defined by a cavity surface 76. The cavity surface 76 has a frusto-conical cavity section 78 and an arcuate cavity section 80. The cavity 73 further contains end cavity surfaces 82.

When assembled, the IMC evaporator boat 22 rests within the cavity 73 in the thermal insulation body 70. The side walls 30 of the IMC evaporator boat 22 rest against the surfaces that define the frusto-conical cavity section 78 of the cavity surface 76. The end walls 32 of the IMC evaporator boat 22 rest against the end cavity surfaces 82 of the cavity 73. There is an air space 84 defined between the bottom surface 34 of the IMC evaporator boat 22 and the cavity surface 76 of the thermal insulation body 70. More specifically, the air space 84 is defined between the bottom surface 34 of the IMC evaporator boat 22 and the arcuate cavity section 80.

Heater elements 90 are positioned within the air space 84. Heater elements 90 can be made from any one of the following materials: molybdenum disilicide or tungsten or an intermetallic composite (e.g., BN—TiB$_2$ or BN—AlN—TiB$_2$) or silicon carbide. A thermocouple 96 is in the air space and extends through the container 52.

Figure 4:
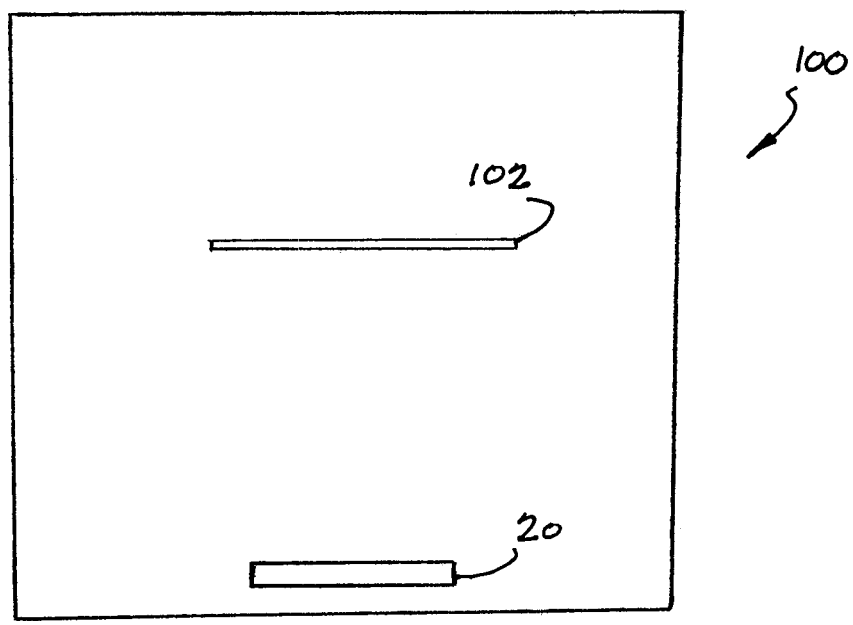
FIG. 4 is a schematic view of a vacuum chamber with the IMC evaporator boat-thermal insulation cartridge assembly therein and a substrate therein.

Referring to FIG. 4, there is a schematic view showing a vacuum chamber 100 with the IMC boat-thermal insulation cartridge assembly 20 therein and a substrate 102 therein. In operation, the metal to be evaporated, which typically is in the form of a wire, is placed in the pool 26 on the top surface 24 of the evaporator boat 22 (of the IMC boat-thermal insulation cartridge assembly 20), and power is supplied to the heaters 90. The heat from the heaters 90 causes the evaporator boat 22 to become hot, which in turn, transfers heat to the metal to be evaporated. Eventually, the metal evaporates, and typically, will be drawn to form a coating on the surface of a substrate 102. Typical arrangements in which an IMC evaporator boat-thermal insulation cartridge assembly is used are shown and described in U.S. Pat. No. 3,113,889 to Cooper et al. (which is hereby incorporated in its entirety herein) and U.S. Pat. No. 5,904,781 to Goodman et al. (which is hereby incorporated in its entirety herein).

The present embodiments provide certain advantages heretofore unavailable. In this regard, earlier IMC evaporator boats have experienced significant heat loss in operation because the electric current was passed directly through the evaporator boats. In the present invention, the use of the IMC evaporator boat in conjunction with the thermal insulation cartridge significantly reduces heat loss during operation. The heat is generated through the heaters which are surrounded by the thermal insulation cartridge so as to reduce heat loss. The IMC evaporator boat is surrounded on all sides but the top surface by the thermal insulation cartridge, which reduces heat loss during operation.

By providing an IMC evaporator boat-thermal insulation cartridge assembly that results in improved reduction of heat losses, there is realized a significant power savings for the overall metal evaporation process. By reducing heat loss during operation, less power is needed to operate the overall metal evaporation process. Therefore, use of the present inventive IMC evaporator boat-thermal insulation cartridge assembly provides a significant operational advantage due to meaningful power savings for the overall process as compared to the use of earlier evaporator boats in a metal evaporation process.

The patents and other documents identified herein are hereby incorporated by reference herein. Other embodiments of the invention will be apparent to those skilled in the art from a consideration of the specification or a practice of the invention disclosed herein. It is intended that the specification and examples are illustrative only and are not intended to be limiting on the scope of the invention. The true scope and spirit of the invention is indicated by the following claims.

What is claimed is:

1. An IMC evaporator boat-thermal insulation cartridge assembly comprising:
    an IMC evaporator boat formed of BN—$TiB_2$ or BN—AlN—$TiB_2$ and having a top surface that contains a metal evaporation pool, the IMC evaporator boat also having side walls, end walls and a bottom surface;
    a thermal insulation cartridge comprising a container containing a thermal insulation body, wherein the thermal insulation body contains a cavity defined by a cavity surface, and the cavity surface comprises a frusto-conical cavity section, an arcuate cavity section and end cavity surfaces;
    the IMC evaporator boat being received within the cavity, wherein the side walls of the IMC evaporator boat contact the frusto-conical cavity section, and a closed space is defined between the bottom surface of the IMC evaporator boat and the arcuate cavity section; and
    a heater contained within the space and isolated from the IMC evaporator boat by the cavity, wherein the heater comprising parallel heating element rods under the bottom surface of the IMC evaporator boat.

2. The IMC evaporator boat-thermal insulation cartridge assembly according to claim 1, wherein a thermocouple is positioned within the closed space.

3. The IMC evaporator boat-thermal insulation cartridge assembly according to claim 1, wherein the end walls of the IMC evaporator boat contact the end cavity surfaces of the cavity.

4. The IMC evaporator boat-thermal insulation cartridge assembly according to claim 1, wherein the thermal insulation body comprises one of the materials selected from the following group: alumina-silica fibers or alumina fibers.

5. The IMC evaporator boat-thermal insulation cartridge assembly according to claim 1, wherein the thermal insulation body is formed of alumina-silica fibers.

6. The IMC evaporator boat-thermal insulation cartridge assembly according to claim 1, wherein the heater comprises one of the materials selected from the group comprising molybdenum disilicide or tungsten or an intermetallic composite or silicon carbide.

7. The IMC evaporator boat-thermal insulation cartridge assembly according to claim 1, wherein the heating element rods extend through a wall of the container.

8. The IMC evaporator boat-thermal insulation cartridge assembly according to claim 1, wherein the heating element rods comprise molybdenum disilicide.

9. The IMC evaporator boat-thermal insulation cartridge assembly according to claim 1, wherein the heating element rods comprise tungsten.

10. The IMC evaporator boat-thermal insulation cartridge assembly according to claim 1, wherein the heating element rods comprise silicon carbide.

* * * * *